(12) United States Patent
Pallasmaa et al.

(10) Patent No.: US 10,165,711 B2
(45) Date of Patent: Dec. 25, 2018

(54) ELECTRICAL DEVICE WITH A COOLING CHANNEL BETWEEN COMPARTMENTS

(71) Applicant: ABB Oy, Helsinki (FI)

(72) Inventors: Aaro Pallasmaa, Helsinki (FI); Jaakko Hyytiä, Vantaa (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/928,335

(22) Filed: Oct. 30, 2015

(65) Prior Publication Data

US 2016/0128229 A1    May 5, 2016

(30) Foreign Application Priority Data

Nov. 4, 2014   (EP) .................................... 14191659

(51) Int. Cl.
*H05K 7/20*   (2006.01)
*H02M 7/00*   (2006.01)

(52) U.S. Cl.
CPC ........ *H05K 7/20918* (2013.01); *H02M 7/003* (2013.01); *H05K 7/20163* (2013.01); *H05K 7/20409* (2013.01)

(58) Field of Classification Search
CPC ........... H05K 7/20163; H05K 7/20909; H05K 7/20918
USPC ........ 363/141; 361/679.46–679.54, 688–723
See application file for complete search history.

(56) References Cited

U.S. PATENT DOCUMENTS

| | | | |
|---|---|---|---|
| 3,356,903 A * | 12/1967 | Arnold .................... | H04B 1/036 361/690 |
| 5,091,823 A * | 2/1992 | Kanbara ................. | H02M 5/44 174/351 |
| 5,218,516 A * | 6/1993 | Collins .............. | H05K 7/20545 361/715 |
| 5,235,491 A * | 8/1993 | Weiss ................. | H05K 7/20918 307/151 |
| 5,424,915 A * | 6/1995 | Katooka ............ | H05K 7/20909 361/695 |
| 5,544,012 A | 8/1996 | Koike | |
| 6,186,890 B1 | 2/2001 | French et al. | |
| 6,747,870 B2 * | 6/2004 | Toh ....................... | H01L 23/467 174/383 |
| 8,072,752 B2 | 12/2011 | Wantschik | |

(Continued)

FOREIGN PATENT DOCUMENTS

CN    1553502 A    12/2004

OTHER PUBLICATIONS

European Patent Office, European Search Report issued in European Patent Application No. 14191659.3 dated Apr. 28, 2015, 6 pp.

(Continued)

*Primary Examiner* — Zachary M Pape
(74) *Attorney, Agent, or Firm* — J. Bruce Schelkopf; Taft Stettinius & Hollister LLP

(57) ABSTRACT

An electrical device comprising electrical components, the electrical components of the electrical device being arranged in at least two separate compartments (1, 2) having walls, wherein the at least two compartments are substantially closed and arranged at a distance from each other and the walls of the at least two compartments are arranged to form walls of a cooling channel (7) between the compartments (1, 2).

19 Claims, 1 Drawing Sheet

(56) References Cited

U.S. PATENT DOCUMENTS

| | | | | |
|---|---|---|---|---|
| 8,553,411 | B2* | 10/2013 | Abraham | G06F 1/20 |
| | | | | 361/679.47 |
| 8,599,554 | B2* | 12/2013 | Harada | H05K 7/20163 |
| | | | | 165/104.33 |
| 8,611,088 | B2* | 12/2013 | Barna | H05K 7/20918 |
| | | | | 165/104.33 |
| 2005/0180102 | A1* | 8/2005 | Kim | G06F 1/20 |
| | | | | 361/694 |
| 2012/0262969 | A1* | 10/2012 | Nagano | H05K 7/20909 |
| | | | | 363/141 |

OTHER PUBLICATIONS

Australian Patent Examination Report No. 1, 2015249128, ABB Technology AG, dated Mar. 8, 2016, pp. 5.

* cited by examiner

ELECTRICAL DEVICE WITH A COOLING CHANNEL BETWEEN COMPARTMENTS

FIELD OF THE INVENTION

The present invention relates to an electrical device, and more particularly to an electrical device having separate compartments for different types of components.

BACKGROUND OF THE INVENTION

Electrical devices, such as inverters, consist of multiple of different electrical components. The components, and thus the electrical device itself, generate heat in a known manner when the device is operated. Some of the electrical components can withstand higher temperatures without affecting the lifetime of the component while other components wear faster when operated in elevated temperature. For example control electronics of a device age more rapidly when the temperature is increased, while passive inductive components can be operated in higher temperatures without affecting the lifetime of the components.

It is known to place the components in different compartments based on the tolerance of temperature and heat generation. For example, in inverter devices, it is known to place the control electronics and the high loss components in different compartments of the device so as to limit the impact of the high loss, high temperature component on the temperature of the control electronics. These separate compartments are typically stacked vertically and placed in a common housing surrounding the compartments. Further, for limiting the effect of the high loss high temperature components on the other components, the compartment with the higher temperature components is typically air cooled with a blower or similar device.

One of the disadvantages associated with the above arrangement is that when the device is made more compact, the temperatures are rising to a level that is harmful for the components that do now withstand elevated temperatures. Further, high IP-class protection with sufficient cooling cannot be achieved with the stacked structure in a simple manner.

BRIEF DESCRIPTION OF THE INVENTION

An object of the present invention is to provide a device so as to solve the above problems. The objects of the invention are achieved by a device which is characterized by what is stated in the independent claim. The preferred embodiments of the invention are disclosed in the dependent claims.

The invention is based on the idea of arranging the component of the electrical device into different compartments which are spaced apart from each other and providing a cooling channel between the compartments. With the cooling channel between the compartments, two or more compartments can be cooled to the channel. Further, as the compartments are at a distance from each other, the heat generated in one compartment does not affect to the temperature of other components in another compartment.

The structure of the invention enables to have a high IP-class protection for the device such that the device can be mounted outdoors. The separate enclosures or compartments for different components makes it further possible to reduce the outer diameter of the device, as heat generating and heat tolerating components can be dimensioned to have a higher temperature, as the heat does not have an impact on the other components situated in a separate compartment.

According to an embodiment of the invention, the device comprises a conduit which is arranged between the separate compartments. The conduit receives electrical wires for connecting electrically the electrical components in the separate compartments. The conduit forms together with the separate compartments a substantially closed structure such that high IP-class protection is obtained.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
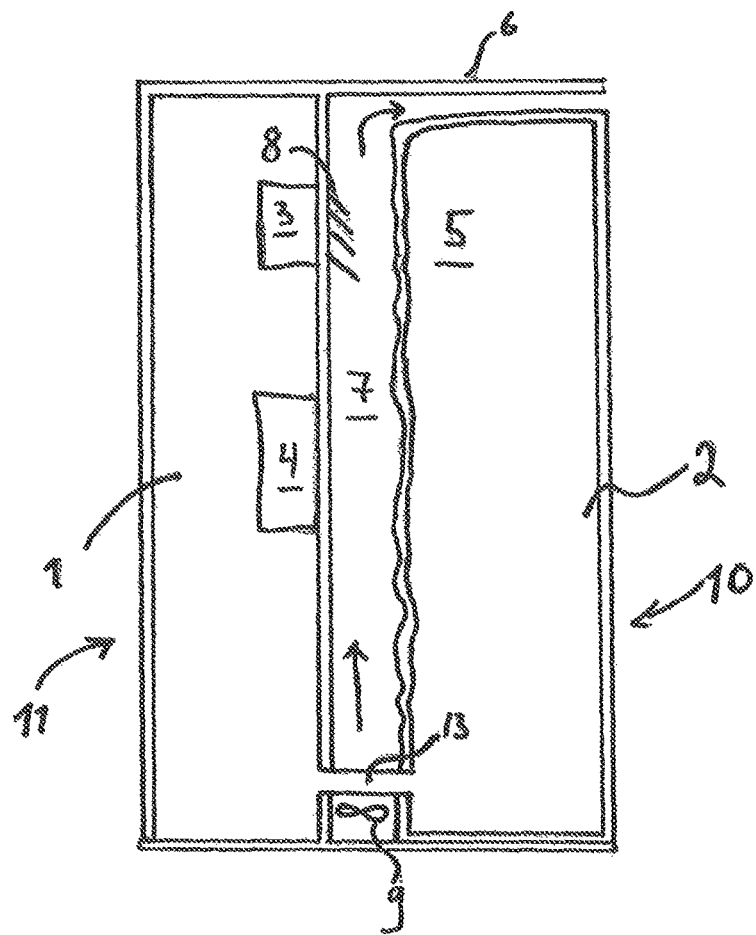
FIG. 1 shows a schematic cross section of an electrical device according to an embodiment of the invention.

FIG. 1 shows a cross section taken from a side of an electrical device in which electronic components of the device are arranged in at least two separate compartments. More specifically, the components of the device are in two compartments 1, 2 in the example of FIG. 1. It is shown in FIG. 1 that the edges 6 of first compartment 1 surround partly the second compartment 2.

The compartments of the device of the invention are substantially closed compartments such that a high IP class is obtained for the device. The IP class obtained with the structure is, for example IP65, which means that the device can be placed in operation outdoors.

The compartments of the device are arranged at a distance from each other. As can be seen in FIG. 1, the compartments are not attached to each other, and a space is left between the compartments. The walls of the compartments facing each other form a part of the walls of a cooling channel 7. Thus a cooling channel is formed inside the device and at part of the channel walls is formed using the walls of the compartments. As shown in FIG. 1, the first compartment 1 partly surrounds the second compartment 2. FIG. 1 is a cross-sectional view from the side of the device. The top of the device is produced from the edge of the first compartment, i.e. a part of the material of the first compartment. Similarly, the sides of the device are formed from the material of the first compartment, and thus the edges of the first compartment limit the width of the cooling channel.

In the example of FIG. 1, the first compartment 1 of the at least two compartments include semiconductor switch components 3. The switch components are preferably attached to cooling ribs 8 which are situated in the cooling channel 7. The semiconductor switch components or a semiconductor switch module is thermally coupled to the cooling ribs so as to remove heat from the first compartment. In an embodiment, the cooling ribs are formed directly as a part of wall of the first compartment 1. In such a case the outer wall of the first enclosure is formed to have ribs or similar extensions that protrude away from the compartment, i.e. towards the cooling channel. The inner wall of the compartment has a substantially flat surface to that a bottom plate of the semiconductor module or the semiconductor switches can be attached to the inside wall of the compartment. The cooling ribs 8 may also be a separate component that is attached to the enclosure such that either the enclosure has an opening that receives the cooling ribs or such that the cooling ribs are attached to the surface of the enclosure.

The first enclosure 1 of FIG. 1 contains also printed circuit board (PCB) 4 installations such as control electronics or similar circuits. Although the semiconductor switches operate in high temperature and generate losses, the compartment is still in substantially low temperature specifically as the semiconductor switches are cooled to the cooling channel with the cooling ribs.

According to an embodiment, the second enclosure 2 of the at least two enclosures contains high temperature and high loss components. Such components of the electrical device are for example output chokes 5 or filter chokes used in the output of the device. The output filter is used to shape the output voltage or current waveform, and the filter may be a LCL-filter consisting of inductances and capacitances. As the output current of an electrical device, such as an inverter, may be high, the losses in the filter tend also be high depending on the amount of filtering needed. The second compartment 2 in the present invention is arranged to be separated and at a distance from the first compartment 1 such that the cooling channel 7 is between the compartments. The cooling channel is at least partly formed of the outer surfaces or walls of the compartments. As mentioned, the high loss and high temperature withstanding components are situated in the second compartment. The difference between the first and second compartment is such that the high temperature compartment is not able to heat the first compartment. As seen in FIG. 1, the second surface of the second compartment is corrugated or patterned such that the surface area that is in connection with the cooling channel is increased. The increased surface area increases also the heat transfer from the compartment to the cooling channel.

The both compartments of FIG. 1 are cooled to the cooling channel 7 meaning that heat is transferred from the compartments through the surfaces or walls of the compartments to the air in the cooling channel. According to an embodiment, the device comprises means for providing forced cooling 9, such as a fan or a blower. However, the structure of the device of the invention may also be cooled without any fan or blower. The fan or blower of the embodiment is situated in such a manner, that the movement of air in the cooling channel is enhanced. As more heat is removed with forced cooling, the temperature of compartments stays lower. The walls of the compartment are produced preferably from a metallic material which is known to transfer heat well. As metal materials are preferred, the used material can, however, be selected freely.

The compartments in FIG. 1 are shown to be formed of a single chamber. However, the compartments can be formed of plurality of separate chambers which are arranged inside the compartments.

The device of the invention is preferably a wall-mounted device having a back side 10 and a front side 11, and the back side is adapted to be installed towards the wall. One of the at least two separate compartments 2 is arranged in the back side of the device and one of the at least two separate compartments 1 is arranged in front side 11 of the device. The cooling channel 7 is arranged to be substantially vertical when the electronic device is in the mounting position. The cross-sectional view taken from a side of the device of FIG. 1 shows that the edges of the first compartment 1 surround partly the second compartment 2. In the example a wall 12 of the second compartment 2 forms also part of the wall 12 of the device. As the device is preferable a wall-mounted device, the part of the wall 12 of the second compartment is intended to be mounted against wall or similar substantially flat surface.

The cooling channel is substantially vertical when the device is in its mounting position. The term vertical in this context refers to the fact that the movement of air in the channel is principally upwards. The walls of the cooling channel may not be straight and may have protrusions or corrugations. The depth of the cooling channel is at least partly set by the distance between the two compartments 1, 2 whereas the width of the cooling channel, when viewed from the front of the device in mounting position, is not restricted to any specific width. The width of the channel may be, for example dependent on the width of the compartments such that the width substantially equals the widths of the compartments. Further, the width of the cooling channel may also be limited by another substantially closed compartment placed in the side of the device. The cooling channel may be formed in desired manner by using sheet metal plates or similar structures attached to the device.

The height of the cooling channel is not limited. It is clear that the height of the channel should be as high as the walls of compartment that form the cooling channel. Further, as the air is drawn in the cooling channel, the channel is extended below the at least two compartments. The cooling air can be drawn to the channel through the bottom of the device or from one multiple of sides of the device. The cooling channel extends also above the at least two compartments for blowing out the air from the device. The outlet of the cooling channel may me formed in the top of the device or in the side of the device. FIG. 1 shows an example in which the inflow of cooling air is from the side of the device and the outflow of the cooling air is arranged to be in the top corner of the device.

The compartments of the electrical device of the invention are substantially closed compartments in such a manner, that high IP-class rating is achieved. For use in outdoors a protection class IP65 is generally required for the device. This means for example that the electronic parts of the device should be dust protected. The enclosures or compartments 1, 2 of the device are structured in such a manner that the compartments are by themselves IP65 rated sealed structures. As the electronic components are situated in different enclosures, the electrical wiring between the enclosures needs to be brought in and out of the enclosures in a sealed manner. Further, the substantially closed compartments of the invention limit the electro-magnetic disturbances emitted by the device. The compartments are preferably manufactured from a metal material and such metal compartments limit the radiated interferences. When the device is, for example, an inverter, the fast switching transients may produce high frequency interferences. The metallic compartments limit effectively the high frequency emissions such that other nearby devices are not disturbed.

In simplest form the electrical components or parts can be connected by conductors that are led through small holes made in the walls of the compartments and by sealing the holes around the conductors tightly. However, this leads to a structure which is not necessarily suitable for obtaining the desired high IP protection, as the conductors are outside the substantially closed compartments.

According to an embodiment of the invention, the electrical device comprises at least one conduit 13 between the at least two separate compartments for holding the electrical conductors. The conduit 13 produces a substantially closed channel between the at least two compartments. The conduit opens at its first end to one of the at least two compartments and at its second end to another of the at least two compartments. The above means that compartments are united in a sealed manner with the conduit. The conductors of the device can be led through the conduit from one compartment to another compartment without exposing the conductors to the surroundings.

In FIG. 1 the conduit 13 is shown as a tubular member that connects the compartments. However, the shape and form of the conduit 13 is not restricted to any specific shape. The main purpose of the conduit is to connect the compartments together in such a manner, that electrical conductors can be led between the compartments and that the compartments are still substantially closed for the purposes of protection from the environmental factors. The closed structure can be obtained by fitting the ends of the hollow conduit to the corresponding holes of the compartments and sealing the joints in a reliable manner. The one or more conduits provide also mechanical protection to the electrical conductors.

According to an embodiment, one or more of the at least one conduits are integrated to one of the compartments. When a conduit is integrated to a compartment, the conduit is formed as a part of the compartment such that the compartment has a hollow extension protruding from the compartment. One or more conduits are preferably integrated to the compartment that situates in the back side of the device, i.e. in that side that is intended to be mounted against the wall. The compartment is accessible through the integrated conduit such that during manufacture of the device, electrical wires can be led through the conduit to the compartment.

Figure 2:
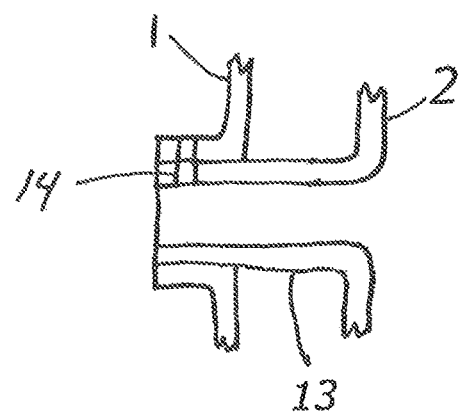
FIG. 2 shows a schematic cross section of the conduit.

According to an embodiment, the integrated conduit of a compartment comprises means for supporting another compartment of the device. More specifically, when the compartment is situated in the back side of the device and comprises one or more integrated conduits, the conduits comprise means for supporting the compartment of the front side of the device. The means for supporting comprises fixing means, such as screw holes 14 (FIG. 2) or similar elements that can be used directly or indirectly to connect the other compartment to the integrated conduits. The free end of the integrated conduit is attached to mating holes in the other compartment, and the fixing means are used for attaching the free end to the other compartment. Suitable sealing is also used so that desired protection class is obtained. When the integrated conduits are used, the cooling channel is formed between the compartments in a simple manner, as the compartments are held firmly at a distance from each other inside the device.

The one or more of the conduits of the embodiment are at least partly situated in the cooling channel. The air flow in the cooling channel removes also heat from the conduit and thereby enhances the cooling of the compartments.

It is clear that the conduit may also be placed such that it is not in the cooling channel. Further, the conduit may be formed of separate pieces that are not integrated to the structure as such.

According to a preferred embodiment of the invention, the electrical device is an inverter, and more specifically a wall-mounted inverter. Such device receives DC voltage as input and outputs AC voltage in a known manner. It is also clear that the device is not necessarily a wall mounted device. The device can be installed in any other known manner.

It should be noted, that the cross section of FIG. 1 is a highly simplified example that is used in describing the various aspects of the invention and its embodiments.

It will be obvious to a person skilled in the art that, as the technology advances, the inventive concept can be implemented in various ways. The invention and its embodiments are not limited to the examples described above but may vary within the scope of the claims.

The invention claimed is:
1. An electrical device comprising electrical components, the electrical components of the electrical device being arranged in at least two separate compartments having walls,
wherein the at least two compartments are closed and arranged at a distance from each other and a first wall of one compartment and a second wall of another compartment are arranged to form walls of a cooling channel between the compartments,
wherein the electrical components arranged in the at least two separate compartments are electrically interconnected with electrical conductors, and the device comprises at least one conduit between the at least two separate compartments adapted to hold the electrical conductors, and
wherein the at least one conduit is at least partly disposed within the cooling channel, one end of the conduit being connected to the first wall and another end of the conduit being connected to the second wall.

2. An electrical device according to claim 1, wherein first compartment of the at least two separate compartments is adapted to hold printed circuit board installations, such as control circuits of the electrical device, and wherein the second compartment of the at least two separate compartments is adapted to hold high loss and high temperature withstanding components, such as output chokes of the electrical device.

3. An electrical device according to claim 2, wherein the cooling channel comprises means for providing forced cooling.

4. An electrical device according to claim 2, wherein the device comprises a back side and a front side, and wherein one of the at least two separate compartments is arranged in the back side of the device and another of the at least two compartments is arranged in the front side of the device, and the cooling channel is arranged to be substantially vertical when the electrical device is in its mounting position.

5. An electrical device according to claim 2, wherein the wall of at least one of the separate compartment forming the cooling channel comprises corrugated pattern to increase the surface area of the wall of the compartment in the cooling channel.

6. An electrical device according to claim 2, wherein the at least one conduit is adapted to produce a substantially closed channel between the two compartments such that the conduit opens at its first end to the first compartment and in the second end to the second compartment.

7. An electrical device according to claim 2, wherein the device is an inverter, and preferably a wall-mounted inverter.

8. An electrical device according to claim 1, wherein the cooling channel comprises means for providing forced cooling.

9. An electrical device according to claim 1, wherein the electrical components arranged in the at least two separate compartments are arranged to be cooled by the cooling channel.

10. An electrical device according to claim 1, wherein the device comprises a back side and a front side, and wherein one of the at least two separate compartments is arranged in the back side of the device and another of the at least two compartments is arranged in the front side of the device, and the cooling channel is arranged to be vertical when the electrical device is in its mounting position.

11. An electrical device according to claim 1, wherein at least one of the separate compartments comprises semiconductor switch components which are thermally connected to cooling ribs located in the cooling channel.

12. An electrical device according to claim 11, wherein the cooling ribs are directly formed to the outer surface of the at least one of the separate compartments.

13. An electrical device according to claim 1, wherein the wall of at least one of the separate compartment forming the cooling channel comprises corrugated pattern to increase the surface area of the wall of the compartment in the cooling channel.

14. An electrical device according to claim 1, wherein one or more of the at least one conduits are integrated to one of the at least two separate compartments and thereby arranged as an integral part of the one of the at least two separate compartments.

15. An electrical device according to claim 14, wherein the one or more of the integrated conduits of the one of the at least two separate compartments comprises means for supporting the other of the two separated compartments of the device.

16. An electrical device according to claim 15, wherein the means for supporting the other of the two separated compartments of the device comprises fixing means for connecting said other compartment of the device to the free ends of the integrated conduits.

17. An electrical device according to claim 1, wherein the at least one conduit is adapted to produce a closed channel between the two compartments such that the conduit opens at its first end to the first compartment and in the second end to the second compartment.

18. An electrical device according to claim 1, wherein the device is an inverter, and preferably a wall-mounted inverter.

19. An electrical device according to claim 1, wherein the conduit is adapted to hold a plurality of the electrical conductors.

* * * * *